US012640538B2

(12) United States Patent
Matsuhama et al.

(10) Patent No.: US 12,640,538 B2
(45) Date of Patent: May 26, 2026

(54) SEMICONDUCTOR LASER ELEMENT, SEMICONDUCTOR LASER DEVICE, SEMICONDUCTOR LASER DEVICE MANUFACTURING METHOD, AND GAS ANALYSIS DEVICE

(71) Applicant: HORIBA, LTD., Kyoto (JP)

(72) Inventors: Makoto Matsuhama, Kyoto (JP); Tomoji Terakado, Kyoto (JP); Yusuke Awane, Kyoto (JP)

(73) Assignee: HORIBA, LTD. (JP)

( * ) Notice: Subject to any disclaimer, the term of this patent is extended or adjusted under 35 U.S.C. 154(b) by 296 days.

(21) Appl. No.: 18/266,478

(22) PCT Filed: Dec. 2, 2021

(86) PCT No.: PCT/JP2021/044328
§ 371 (c)(1),
(2) Date: Jun. 9, 2023

(87) PCT Pub. No.: WO2022/124197
PCT Pub. Date: Jun. 16, 2022

(65) Prior Publication Data
US 2024/0030683 A1      Jan. 25, 2024

(30) Foreign Application Priority Data

Dec. 9, 2020      (JP) ................................. 2020-204525

(51) Int. Cl.
*H01S 5/00*          (2006.01)
*H01S 5/042*          (2006.01)
(Continued)

(52) U.S. Cl.
CPC ........ *H01S 5/1014* (2013.01); *H01S 5/04256* (2019.08); *H01S 5/06258* (2013.01);
(Continued)

(58) Field of Classification Search
CPC .............. H01S 5/1014; H01S 5/04256; H01S 5/06258; H01S 5/125; H01S 5/20;
(Continued)

(56) References Cited

U.S. PATENT DOCUMENTS 5,793,521 A      8/1998   O'Brien et al.
9,077,144 B2      7/2015   Zucker et al.
(Continued)

FOREIGN PATENT DOCUMENTS

CN      105075038 A      11/2015
CN      105161976 A      12/2015
(Continued)

OTHER PUBLICATIONS

EESR dated Nov. 27, 2024 issued in EP patent application No. 21903301.6.
(Continued)

*Primary Examiner* — Kinam Park
(74) *Attorney, Agent, or Firm* — Brooks Kushman P.C.

(57)      ABSTRACT

The present invention enables single mode light to be stably output while also enabling the intensity thereof to be increased, and is a distributed feedback type of semiconductor laser element in which a diffraction grating is formed on a waveguide. The waveguide includes a diffraction grating portion where the diffraction grating is formed, and a flat portion having a region where the diffraction grating is not formed and whose width is broader than the diffraction grating portion. The flat portion has a connecting portion having a region whose width changes continuously approaching a connection location with the diffraction grating portion, and a high-reflection film is provided on an end surface of the flat portion that is on an opposite side from the connecting portion, while an anti-reflection film is provided
(Continued)

on an end surface of the diffraction grating portion that is on an opposite side from the connecting portion.

10 Claims, 9 Drawing Sheets

(51) Int. Cl.
| | |
|---|---|
| *H01S 5/0625* | (2006.01) |
| *H01S 5/10* | (2021.01) |
| *H01S 5/125* | (2006.01) |
| *H01S 5/20* | (2006.01) |
| *H01S 5/34* | (2006.01) |
| *H01S 5/343* | (2006.01) |
| *G01N 21/59* | (2006.01) |
| *H01S 5/12* | (2021.01) |

(52) U.S. Cl.
CPC ............... *H01S 5/125* (2013.01); *H01S 5/20* (2013.01); *H01S 5/3402* (2013.01); *H01S 5/34313* (2013.01); *G01N 21/59* (2013.01); *G01N 2201/06113* (2013.01); *H01S 5/12* (2013.01); *H01S 2301/166* (2013.01); *H01S 2304/04* (2013.01)

(58) Field of Classification Search
CPC ...... H01S 5/3402; H01S 5/34313; H01S 5/12; H01S 2301/166; H01S 2304/04; H01S 5/0287; H01S 5/22; H01S 5/3401; H01S 2301/176; H01S 5/02257; H01S 5/02216; H01S 5/02415; G01N 21/3504
See application file for complete search history.

(56) References Cited

U.S. PATENT DOCUMENTS

| | | | | |
|---|---|---|---|---|
| 10,008,829 | B2 * | 6/2018 | Dougakiuchi | ........ H01S 5/2018 |
| 2003/0169787 | A1 * | 9/2003 | Vurgaftman | ........... B82Y 10/00 |
| | | | | 372/102 |
| 2003/0198269 | A1 | 10/2003 | Wesstrom | |
| 2012/0093187 | A1 * | 4/2012 | Koeth | ................... H01S 5/1228 |
| | | | | 372/45.01 |
| 2015/0270684 | A1 * | 9/2015 | Suzuki | ................. H01S 5/1032 |
| | | | | 372/45.01 |
| 2015/0285737 | A1 * | 10/2015 | Gliere | ............... G01N 21/3504 |
| | | | | 438/31 |
| 2016/0322787 | A1 | 11/2016 | Takabayashi et al. | |
| 2020/0295535 | A1 | 9/2020 | Awane et al. | |
| 2021/0006037 | A1 | 1/2021 | Terakado et al. | |

FOREIGN PATENT DOCUMENTS

| | | | |
|---|---|---|---|
| CN | 107431331 | A | 12/2017 |
| CN | 108604774 | A | 9/2018 |
| JP | 05-218594 | A | 8/1993 |
| JP | 08-107253 | A | 4/1996 |
| JP | 11-340563 | A | 12/1999 |
| JP | 2002-368327 | A | 12/2002 |
| JP | 2007-243072 | A | 9/2007 |
| WO | WO2019/116657 | A | 6/2019 |
| WO | WO2019/116660 | A1 | 6/2019 |

OTHER PUBLICATIONS

International Search Report dated Jan. 11, 2022 issued for International application No. PCT/JP2021/044328.
Jérôme Faist, Quantum Cascade Lasers, 2013, pp. 108-111, Oxford University Press, Oxford, United Kingdom.
Office Action dated Mar. 20, 2026 issued in CN patent application No. 202180081506.8.

* cited by examiner

SEMICONDUCTOR LASER ELEMENT, SEMICONDUCTOR LASER DEVICE, SEMICONDUCTOR LASER DEVICE MANUFACTURING METHOD, AND GAS ANALYSIS DEVICE

CROSS-REFERENCE TO RELATED APPLICATIONS

This application is the U.S. national phase of PCT Application No. PCT/JP2021/044328, filed Dec. 2, 2021, which claims priority to Japanese Patent Application No. 2020-204525, filed Dec. 9, 2020, the disclosures of which are incorporated in their entirety by reference herein.

TECHNICAL FIELD

The present invention relates to a semiconductor laser element, a semiconductor laser device, a semiconductor laser device manufacturing method, and a gas analysis device.

TECHNICAL BACKGROUND

Conventionally, a mid-infrared laser absorption method (QCL-IR) exists as one gas analysis method that employs a quantum cascade laser (QCL) that generates a laser oscillation in a mid-infrared range.

This QCL-IR gas analysis device irradiates laser light from a quantum cascade laser onto a sample containing a subject being measured, and then detects the intensity of the laser light transmitted through this sample using a photodetector. The subject being measured is then analyzed using the resulting detection signal. Here, it is necessary for the quantum cascade laser to perform control such that the oscillation wavelength is set to a wavelength that is suitable for the subject being measured, and for a single wavelength of light in the desired oscillation wavelength to be efficiently extracted. In order to achieve this, a device such as that disclosed in Patent Document 1, for example, is used.

In this quantum cascade laser, in order for a single wavelength of light in the desired oscillation wavelength to be extracted, a periodic diffraction grating that corresponds to the oscillation wavelength is formed in the waveguide. In addition, in this quantum cascade laser, in order to improve the single mode characteristics of the laser light, it is desirable that the width dimension of the waveguide be reduced. Moreover, in order to increase the output (i.e., the gain) of the laser light, it is desirable that the width dimension and the longitudinal dimension of the waveguide be increased.

However, if the width dimension of the waveguide is reduced (by approximately not more than twice the oscillation wavelength) in order to improve the single mode characteristics of the laser light, then the output (i.e., the gain) of the laser light ends up being decreased. On the other hand, if the width dimension or the longitudinal dimension of the waveguide is increased in order to increase the intensity of the laser light, then the problem arises that the single mode characteristics of the laser light end up becoming deteriorated. In other words, there is a tradeoff relationship between the single mode characteristics of the laser light and the optical output (i.e., the gain) in the width dimension of the waveguide.

Moreover, if, in order to increase the intensity of the laser light, the width dimension or the longitudinal dimension of the waveguide is increased, then the power consumption required for the laser oscillation increases. As a result, there is a considerable rise in the temperature of the semiconductor laser element, so that the chirp rate of the laser oscillation wavelength increases and the resolution when performing a gas analysis deteriorates markedly.

DOCUMENTS OF THE PRIOR ART

Patent Documents

[Patent Document 1] Japanese Unexamined Patent Application (JP-A) No. H8-107253

DISCLOSURE OF THE INVENTION

Problems to be Solved by the Invention

In view of the above-described problems, as is shown in FIG. 9, by forming, in a waveguide having a diffraction grating, a diffraction grating portion where a diffraction grating is formed and a flat portion where no diffraction grating is formed, the inventors of the present application attempted to improve the single mode characteristics by reducing the width dimension of the diffraction grating portion and, at the same time, to increase the output (i.e., the gain) of the laser light by increasing the width dimension of the flat portion.

However, in the above-described structure, an unintended reflection was generated in corner portions formed between the diffraction grating portion and the flat portion, and it was discovered that the single mode characteristics were impeded.

The present invention was therefore conceived in order to solve the above-described problems, and it is a principal object thereof to enable single mode light to be output stably from a semiconductor laser element while also enabling the light output (i.e., gain) therefrom to be increased.

Means for Solving the Problem

In other words, a semiconductor laser element according to the present invention is a semiconductor laser element in which a diffraction grating is formed on a waveguide, and is characterized in that the waveguide includes a diffraction grating portion where the diffraction grating is formed, and a flat portion having a region where the diffraction grating is not formed and whose width is broader than that of the diffraction grating portion, and in that the flat portion has a connecting portion having a region whose width changes continuously approaching a connection location with the diffraction grating portion, and a high-reflection film is provided on an end surface of the flat portion that is on an opposite side from the connecting portion, and an anti-reflection film is provided on an end surface of the diffraction grating portion that is on an opposite side from the connecting portion.

By employing this type of semiconductor laser element, because there is provided a diffraction grating portion having a narrow width and a flat portion having a broad width, it is possible to improve the single mode characteristics while also increasing the output (i.e., the gain) of the laser light. Moreover, because the flat portion has a connecting portion whose width changes continuously as it approaches a connection location where the flat portion connects with the diffraction grating portion, it is possible to reduce unintended reflection, and to stably output single mode light. Moreover, because a high-reflection film is provided on an end surface of the flat portion that is on an opposite side from the connecting portion, and an anti-reflection film is provided on an end surface of the diffraction grating portion that is on an opposite side from the connecting portion, it is possible to stably output single mode light from an end surface of the diffraction grating portion. In this way, because an end surface of the diffraction grating portion that is on the opposite side from the connecting portion is formed as a light-emitting surface, it is possible improve even further the single mode characteristics.

A specific aspect that may be considered is a structure in which the width of the connecting portion becomes continuously narrower as it approaches the connection location with the diffraction grating portion.

In addition, a structure in which a maximum width of the connecting portion is not more than a maximum width of portions of the flat portion other than the connecting portion, and a minimum width of the connecting portion is not less than a maximum width of the diffraction grating portion may also be considered.

It is desirable that the flat portion include a rectangular portion that is formed in a rectangular shape, and the connecting portion.

More specifically, in order to reduce unintended reflection between diffraction grating portion and the connecting portion, or between the flat portion and the connecting portion, it is desirable that the connection location between the diffraction grating portion and the connecting portion, and/or the connection location between the flat portion and the connecting portion be formed in an R shape.

A specific aspect of the connecting portion may also be a structure in which the connecting portion has a tapered portion whose width becomes continuously narrower approaching the connection location with the diffraction grating portion, and a narrow-width portion that joins together the tapered portion and the diffraction grating portion.

In order to emit single mode light while suppressing transverse mode oscillation, it is desirable that a width dimension of a light-emitting end of the waveguide be 1-2 times the oscillation wavelength.

In order to be able to easily achieve both a stabilization of the single mode light and an increase in the light output (i.e., the gain), it is desirable that a surface area of the region where the diffraction grating is not formed be not less than a surface area of a region where the diffraction grating is formed.

It is desirable that there be provided a first electrode that supplies current to the diffraction grating portion, and a second electrode that is provided separately from the first electrode and supplies current to the flat portion.

By employing this type of structure, it is possible to control the current flowing to the diffraction grating portion and the current flowing to the flat portion independently of each other. As a result, it is possible to decrease the current supplied to the diffraction grating portion, and to reduce the chirp rate which is the rate at which the oscillation wavelength changes when the current is supplied in pulses, and to improve the resolution in a case in which this semiconductor laser element is used in a gas analysis device.

In a case in which a diffraction grating is formed in the connecting portion, because the width of the region where the diffraction grating is formed changes, it is possible to conceive of cases in which single mode light becomes unstable. For this reason, it is desirable that the connecting portion be a region where no diffraction grating is formed.

By employing this type of structure, it is possible to improve the single mode characteristics even further.

Moreover, a semiconductor laser device manufacturing method according to the present invention is a method of manufacturing a semiconductor laser device in which a diffraction grating is formed on a waveguide and that is characterized by including structural body formation in which there is formed on a substrate a laminated structural body having a diffraction grating region where the diffraction grating is formed and a flat region where the diffraction grating is not formed, and waveguide formation in which a waveguide is formed by etching the laminated structural body in such a way that the laminated structural body is provided with a diffraction grating portion where the diffraction grating is formed, and a flat portion having a region where the diffraction grating is not formed and whose width is broader than that of the diffraction grating portion, and in such a way that the flat portion includes a connecting portion having a region whose width changes continuously approaching a connection location with the diffraction grating portion.

Furthermore, a semiconductor laser device according to the present invention is a semiconductor laser device that is provided with a substrate, and a semiconductor laser element that is disposed on the substrate, and is characterized in that the semiconductor laser element is a distributed feedback type of laser in which a diffraction grating is formed on a waveguide, and in that the waveguide includes a diffraction grating portion where the diffraction grating is formed, and a flat portion having a region where the diffraction grating is not formed and whose width is broader than that of the diffraction grating portion, and in that the flat portion has a connecting portion having a region whose width changes continuously approaching a connection location with the diffraction grating portion.

In addition, the present invention is a gas analysis device that analyzes a subject to be measured that is contained in a gas, and that is characterized in having a measurement cell into which the gas is introduced, the above-described semiconductor laser device that irradiates laser light onto the measurement cell, a photodetector that detects laser light transmitted through the measurement cell, and an analysis portion that analyzes the subject to be measured using a detection signal from the photodetector.

Effects of the Invention

According to the present invention that is formed in the above-described manner, in a semiconductor laser element it is possible to stably output single mode light while also increasing the light output (i.e., gain).

BEST EMBODIMENTS FOR IMPLEMENTING THE INVENTION

Hereinafter, an embodiment of a semiconductor laser device according to the present invention will be described with reference to the drawings.

1. Device Structure

Figure 1:
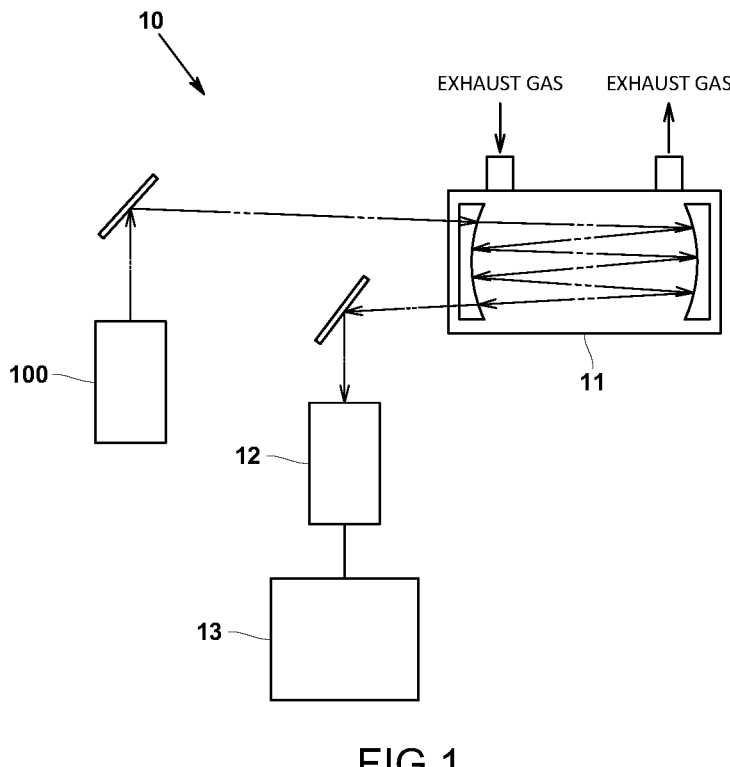
FIG. 1 is an overall schematic view of an exhaust gas analysis device in which a semiconductor laser device according to the present embodiment is used.

As is shown in FIG. 1, a semiconductor laser device 100 of the present embodiment is used in a gas analysis device 10 that analyzes a component to be measured contained, for example, in exhaust gas emitted from an internal combustion engine. Here, the gas analysis device 10 includes a multiple-reflection type measurement cell 11 into which exhaust gas is introduced, the semiconductor laser device 100 that irradiates laser light onto the measurement cell 11, a photodetector 12 that detects laser light transmitted through the measurement cell 11, and an analysis portion 13 that analyzes the component to be measured using a detection signal from the photodetector 12.

Figure 2:
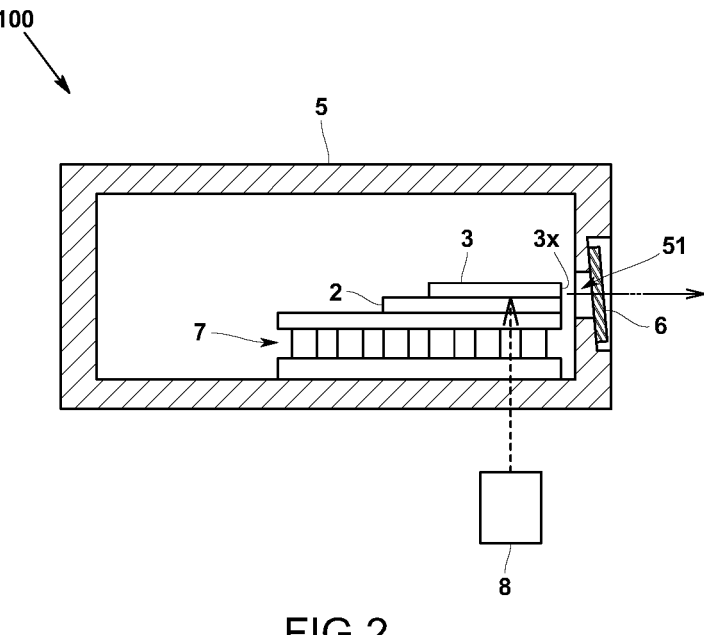
FIG. 2 is an overall schematic view of the semiconductor laser device of the same embodiment.
Figure 3:
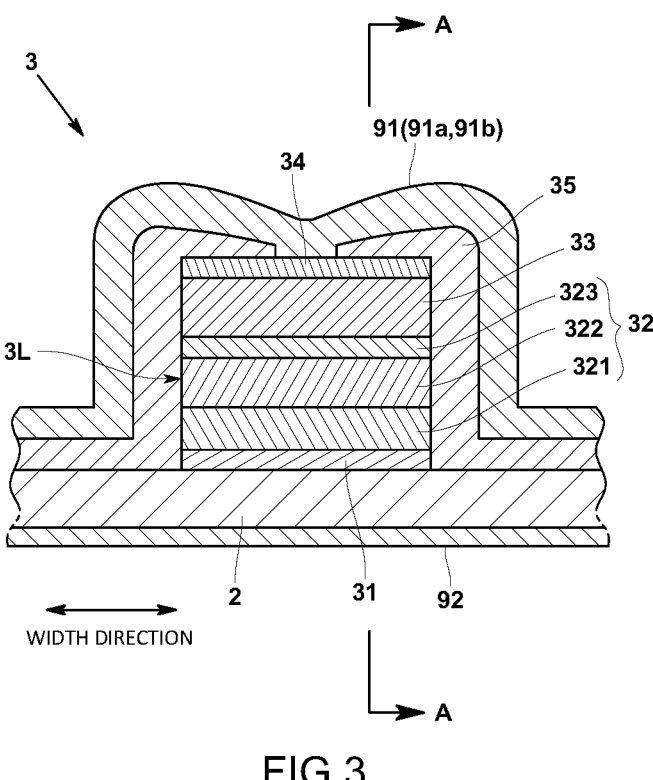
FIG. 3 is a cross-sectional view taken in an orthogonal direction relative to a waveguide direction of a semiconductor laser element of the same embodiment.

More specifically, the semiconductor laser device 100 emits laser light having an oscillation wavelength of ±1 $cm^{-1}$ relative to the absorption wavelength of the component to be measured and, as is shown in FIG. 2 and FIG. 3, includes a semiconductor substrate 2 such as an InP substrate or the like, and a semiconductor laser element 3 that is formed on the semiconductor substrate 2.

Note that the semiconductor substrate 2 on which the semiconductor laser element 3 is disposed is housed within an airtight container 5 such as a butterfly package or the like. A light-guiding portion 51 that is used to guide laser light to the outside is formed in a location of this airtight container 5 that faces towards a light-emitting surface 3x of the semiconductor laser element 3. An optical window component 6 is provided in this light-guiding portion 51, and this optical window component 6 is slightly tilted (for example, by 2 degrees) so that laser light reflected by the optical window component 6 is not reflected back to the semiconductor laser element 3. In addition to these, a cooling module 7 or the like that is used to cool the semiconductor laser element 3 is also housed within the airtight container 5.

Figure 4:
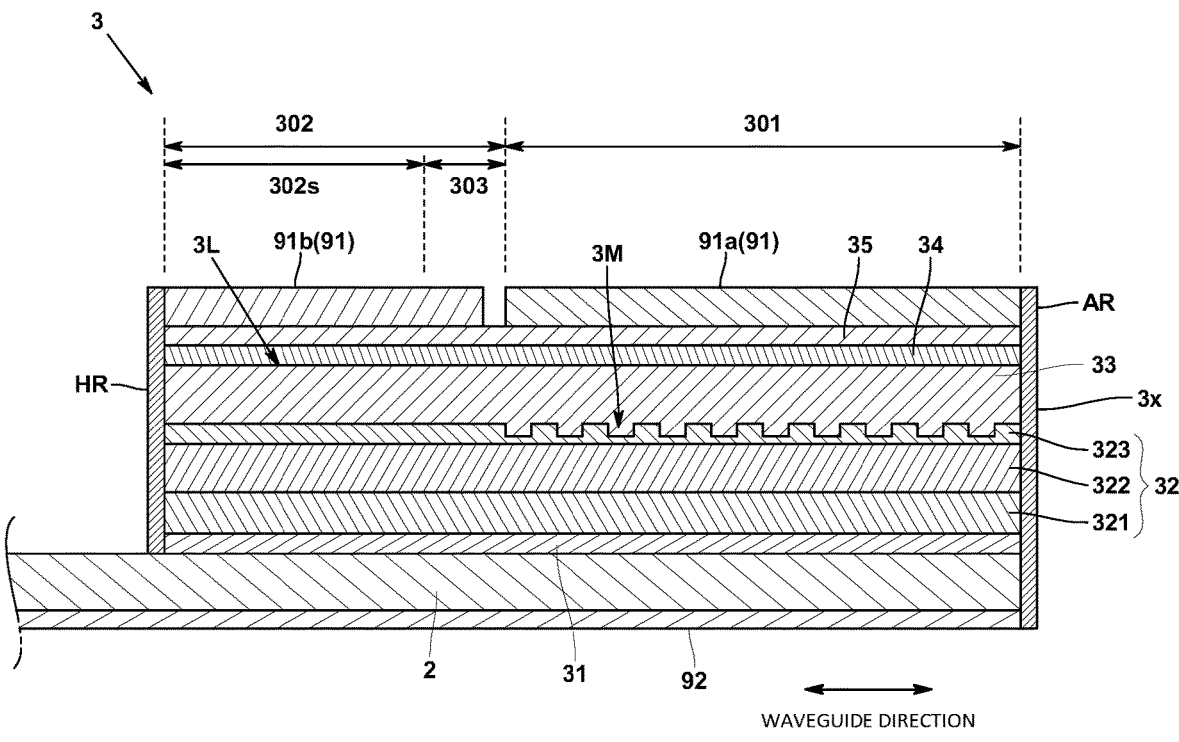
FIG. 4 is a cross-sectional view taken across a line A-A of the semiconductor laser element of the same embodiment.

As is shown in FIG. 3 and FIG. 4, the semiconductor laser element 3 is a distributed feedback (DFB) type of device, and is provided with a waveguide 3L that is formed by a cladding layer and a core layer that are provided on the semiconductor substrate 2. In this waveguide 3L, light is transmitted through the core layer due to a difference between the refractive index of the cladding layer and the refractive index of the core layer.

More specifically, in the semiconductor laser element 3, a buffer layer 31, a core layer 32, an upper cladding layer 33, and a capping layer 34 are formed in this sequence on an upper surface of the semiconductor substrate 2. Each one of these layers 31 through 34 extends in the same direction. Moreover, the waveguide 3L is formed so as to extend in a single direction as a result of each of these layers 31 through 34 extending in the same direction, and side surfaces in a width direction thereof being covered by a protective film 35. Note that the protective film 35 is an inorganic film, and may be formed, for example, from $SiO_2$, or from a combination of $SiO_2$ and $Si_3N_4$.

Each of the buffer layer 31 and the upper cladding layer 33 is formed by a layer of InP. Note that it is also possible to provide a lower cladding layer that is also formed from InP between the buffer layer 31 and the core layer 32, or to cause the buffer layer 31 to additionally function as a cladding layer.

The capping layer 34 is formed by a layer of InGaAs, and a portion (i.e., a central portion in a width direction thereof) of an upper surface thereof is covered by an upper electrode 91.

The core layer 32 includes a lower guide layer 321 that is formed from InGaAs, an active layer 322 that emits light upon being supplied with an electric current, and an upper guide layer 323 that is also formed from InGaAs.

The active layer 322 is formed by a multiple quantum well structure having a plurality of well layers, and is formed by alternately stacking a predetermined number of semiconductor layers that form light-emitting regions with semiconductor layers that form injection regions. Note that the semiconductor layers that form light-emitting regions are formed by alternately stacking layers of InGaAs with layers of InAlAs, while the semiconductor layers that form injection regions are formed by alternately stacking layers of InGaAs with layers of InAlAs.

Figure 6:
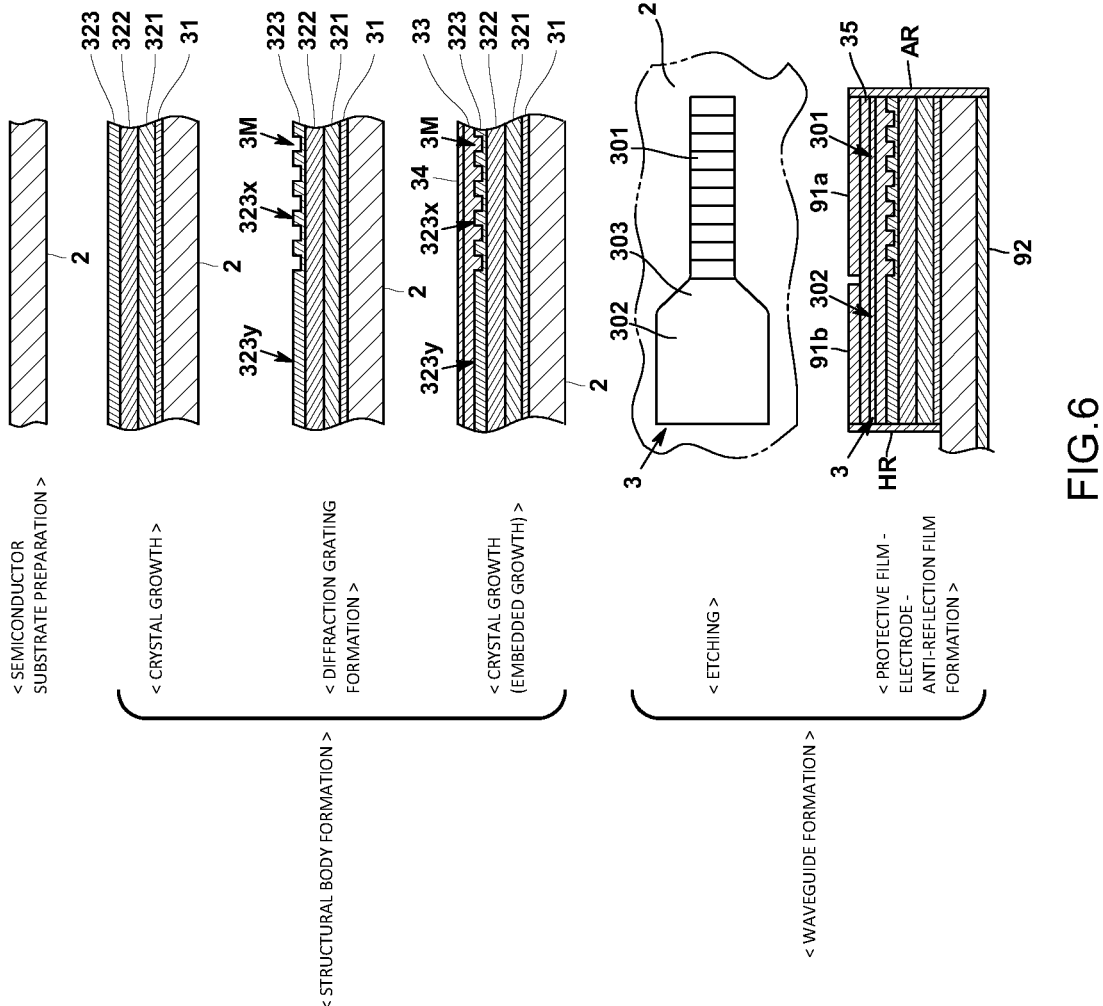
FIG. 6 is a schematic view showing a method of manufacturing the semiconductor laser device of the same embodiment.

As is shown in FIG. 6, the semiconductor element 3 that is formed in the manner described above is a quantum cascade laser in which a plurality of well layers are connected together in multiple stages, and that emits light by means of an optical transition between sub-bands that are formed in these quantum wells.

In this semiconductor laser element 3 a diffraction grating 3M is formed between the core layer 32 and the upper cladding layer 33, in other words, on top of the upper guide layer 323 (see FIG. 4). This diffraction grating 3M is formed by recessed portions and protruding portions that are formed alternately on the upper guide layer 323, and these recessed portions and protruding portions extend in the width direction upper guide layer 323. Light of a predetermined oscillation wavelength is mutually reinforced and is selectively amplified by this diffraction grating 3M. Note that the predetermined oscillation wavelength is prescribed by the pitch of the diffraction grating 3M.

A lower electrode 92 is provided at a portion of a lower surface of the semiconductor substrate 2 that is located underneath the semiconductor laser element 3. A predetermined oscillation wavelength prescribed by the diffraction grating 3M is emitted as a result of current (or voltage) for laser oscillation being supplied to the upper electrode 91 and the lower electrode 92. A current source (or a voltage source) is connected to the upper electrode 91 and the lower electrode 92 for laser oscillation, and a laser control device 8 controls this current source (or voltage source) (see FIG. 2).

2. Characteristic Structure of the Semiconductor Laser Element 3

Figure 5:
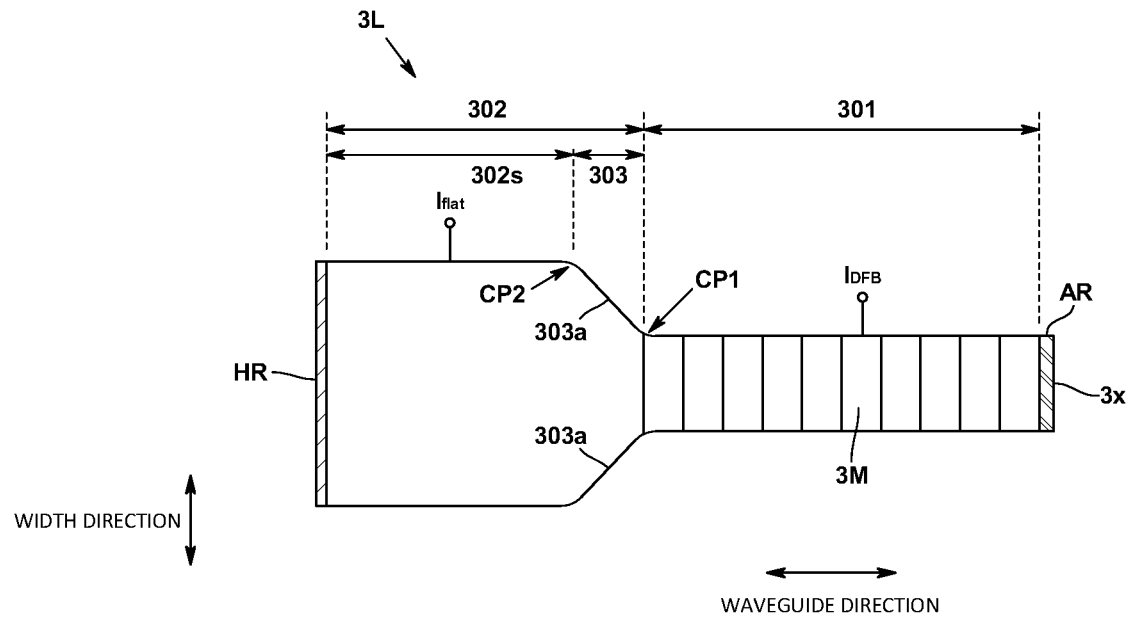
FIG. 5 is a plan view showing a waveguide of the semiconductor laser element of the same embodiment.

In this way, as is shown in FIG. 4 and FIG. 5, a diffraction grating portion 301 in which the diffraction grating 3M is formed, and a flat portion 302 in which the diffraction grating 3M is not formed are provided in the waveguide 3L in the semiconductor laser element 3 of the present embodiment.

The diffraction grating portion 301 is used in order to obtain the aforementioned predetermined oscillation wavelength. The diffraction grating portion 301 extends in a straight line in the longitudinal direction when looked at in plan view, and has essentially the same width in a width direction that is orthogonal to this longitudinal direction. As is described above, the diffraction grating 3M that is formed in this diffraction grating portion 301 is formed by recessed portions and protruding portions that are formed alternately between the core layer 32 and the upper cladding 33, in other words, on the upper guide 323. In addition, a width dimension of the diffraction grating portion 301 is formed so as to be 1-2 times the predetermined oscillation wavelength. By employing this type of structure, the width dimension of the light-emitting end of the waveguide 3L is 1-2 times the oscillation wavelength so that single mode light can be efficiently emitted while horizontal mode oscillation can be suppressed.

The flat portion 302 is used in order to increase the light output (i.e., the gain). The flat portion 302 is the region where the above-described diffraction grating 3M is not formed and whose width is broader width than that of the diffraction grating portion 301. The flat portion 302 of the present embodiment includes a rectangular portion 302s that is formed substantially in a rectangular shape when looked at in plan view, and a connecting portion 303 whose width changes continuously as it approaches a connection location CP1 with the diffraction grating portion 301. This flat portion 302 is formed between the core layer 32 and the upper cladding layer 32 as a result of the recessed portions and protruding portions not being formed on the upper guide layer 323.

The flat portion 302 has the connecting portion 303 whose width changes continuously as it approaches a connection location with the diffraction grating portion 301. This connecting portion 303 has a portion whose width becomes gradually broader as it approaches the rectangular portion 302s from the diffraction grating portion 301. In the present embodiment, the entire connecting portion 303 is formed such that the width thereof becomes gradually broader as it approaches the rectangular portion 302s from the diffraction grating portion 301. Namely, the connecting portion 303 has a tapered shape approaching the diffraction grating portion 301 from the rectangular portion 302s. In other words, the connecting portion 303 is formed such that the width thereof becomes continuously narrower as it approaches the connection location where it connects with the diffraction grating portion 301. Moreover, the width dimension on the diffraction grating portion 301 side of the connecting portion 303 is the same as the width dimension of the diffraction grating portion 301, and sides 303a on both sides in the width direction of the connecting portion 303 are continuous with sides on both sides in the width direction of the rectangular portion 302s. In contrast, the width dimension on the rectangular portion 302s side of the connecting portion 303 is the same as the width dimension of the rectangular portion 302s, and the sides 303a on both sides in the width direction of the connecting portion 303 are continuous with sides on both sides in the width direction of the diffraction grating portion 301. If this type of structure is employed, then a maximum width of the connecting portion 303 is equal to or less than a maximum width of portions of the flat portion 302 other than the connecting portion 303, and a minimum width of the connecting portion 303 is equal to or more than a maximum width of the diffraction grating portion 301. Furthermore, the sides 303a on both sides in the width direction of the connecting portion 303 are formed as straight lines. Moreover, the connecting portion 303 of the present embodiment is also a region where the diffraction grating 3M is not formed.

In the present embodiment, the connection location CP1 between the diffraction grating portion 301 and the connecting portion 303, and/or the connection location CP2 between the rectangular portion 302s and the connecting portion 303 may be formed in an R shape. More specifically, when looked at in plan view, the sides on both sides in the width direction of the diffraction grating 301 and the sides 303a on both sides in the width direction of the connecting portion 303 are connected together in a circular arc shape, while the sides on both sides in the width direction of the rectangular portion 302s and the sides 303a on both sides in the width direction of the connecting portion 303 are connected together in a circular arc shape. In other words, a structure containing no angular shapes is formed between the diffraction grating portion 301 and the rectangular portion 302. As a result, it is possible to reduce any unintended reflection between the diffraction grating portion 301 and the connecting portion 303, or between the rectangular portion 302s and the connecting portion 303.

Here, in the waveguide 3L of the semiconductor laser element 3 of the present embodiment, the surface area of the region where the diffraction grating 3M is not formed may be formed so as to be equal to or greater than a surface area of a region where the diffraction grating 3M is formed.

In the semiconductor laser element 3 having the structure described above, an end surface of the diffraction grating portion 301 that is on an opposite side from the connecting portion 303 forms the light-emitting surface 3x. In addition, a high-reflection film HR is provided on an end surface of the flat portion 302 (i.e., the rectangular portion 302s) that is on an opposite side from the connecting portion 303, and an anti-reflection film AR is provided on an end surface of the diffraction grating portion 301 that is on an opposite side from the connecting portion 303. Here, the light-emitting surface 3x is formed as a result of the anti-reflection film AR being provided on the end surface of the diffraction grating portion 301 that is on the opposite side from the connecting portion 303.

Moreover, as is shown in FIG. 4, the upper electrode 91 of the semiconductor laser element 3 includes a first electrode 91a that is used to supply current to the diffraction grating portion 301, and a second electrode 91b that is provided separately from the first electrode 91a and is used to supply current to the flat portion 302. If this type of structure is employed, then a current $I_{flat}$ supplied to regions where the diffraction grating 3M is not provided and a current $I_{DFB}$ supplied to a region where the diffraction grating 3M is provided (i.e., a DFB region) can be individually controlled.

3. Method of Manufacturing the Semiconductor Laser Device 100

Next, a method of manufacturing the semiconductor laser device 100 will be described with reference to FIG. 6.

An InP layer that forms the buffer layer 31, an InGaAs layer that forms the lower guide layer 321, an InGaAs layer and an InAlAs layer that form the active layer 322, and an InGaAs layer that forms the upper guide layer 323 are laminated on an upper surface of the semiconductor substrate 2 using a metalorganic vapor phase epitaxy method (i.e., a MOVPE method).

A diffraction grating region 323x in which the diffraction grating 3M is formed by means of photolithography and wet-etching, and a flat region 323y where the diffraction grating 3M is not formed are formed on an upper surface of the upper guide layer 323. In addition, an InP layer that forms the upper cladding layer 33, and an InGaAs layer that forms the capping layer 34 are laminated on an upper portion of the upper guide layer 323 using a metalorganic vapor phase epitaxy method (i.e., a MOVPE method). As a result, a laminated structural body is formed having the diffraction grating region 323x where the diffraction grating 3M is formed on the semiconductor substrate 2, and the flat region 323y where the diffraction grating 3M is not formed (structural body formation).

The waveguide 3L is then formed by performing etching processing on the laminated structural body formed in this manner. More specifically, etching processing is performed on the laminated structural body so as to form the waveguide 3L that is provided with the diffraction grating portion 301, in which the diffraction grating 3M is formed, and the flat portion 302, which is the region where the diffraction grating 3M is not formed and whose width is broader than the diffraction grating portion 301, with the flat portion 302 also having the connecting portion 303 whose width changes continuously as it approaches a connection location with the diffraction grating portion 301 (waveguide formation).

In addition, the protective film 35 is formed from SiO$_2$, for example, so as to cover both sides in the width direction of the waveguide 3L. The semiconductor laser element 3 is thus formed. Note that it is also conceivable for a plurality of semiconductor laser elements 3 to be formed on a single semiconductor substrate 2.

Next, the upper electrode 91 (i.e., 91a and 91b) and lower electrode 92 for laser oscillation are formed on the semiconductor laser element 3. In addition, the anti-reflection film AR is formed at one end surface of the diffraction grating portion 301, while the high-reflection film HR is formed at one end surface of the flat portion. Next, the semiconductor substrate 2 is cut for each of the regions thereof that have a semiconductor laser element 3 so as to form a semiconductor laser chip. This semiconductor laser chip is then mounted in the cooling module 7 and, in this state, is disposed inside the airtight container 5.

4. Effects Obtained from the Present Embodiment

If the semiconductor laser device 100 described above is employed, because there are provided the diffraction grating portion 301 that has a narrow width, and the flat portion 302 that has a broad width, it is possible to improve the single mode characteristics thereof while also increasing the output (i.e., the gain) of the laser light. Moreover, because the flat portion 302 has the connecting portion 303 whose width changes continuously as it approaches a connection location with the diffraction grating portion 301, it is possible to reduce unintended reflection, and to stably output single mode light. Moreover, because the high-reflection film HR is provided on an end surface of the flat portion 302 that is on an opposite side from the connecting portion 303, and the anti-reflection film AR is provided on an end surface of the diffraction grating portion 301 that is on an opposite side from the connecting portion 303, it is possible to stably output single mode light from an end surface of the diffraction grating portion 301. In this way, because an end surface of the diffraction grating portion 301 that is on the opposite side from the connecting portion 303 is formed as a light-emitting surface, it is possible improve the single mode characteristics even more.

Moreover, in a structure in which the surface area of the region where the diffraction grating 3M is not formed is equal to or greater than a surface area of the region where the diffraction grating 3M is formed, because there are provided the first electrode 91a that supplies current to the diffraction grating portion 301 and the second electrode 91b that supplies current to the flat portion 302, even if the overall current (i.e., $I_{flat}+I_{DBF}$) is increased in order to obtain a high light output (i.e., gain), it is possible to reduce the current $I_{DBF}$ that is supplied to the region where the diffraction grating 3M is provided. As a result, it is possible to suppress a rise in the temperature of the diffraction grating portion 301, and to lower the chirp rate, and to also improve the resolution in a case in which this semiconductor laser device 100 is used in the gas analysis device 10.

5. Additional Embodiments

Note that the present invention is not limited to the above-described embodiment.

Figure 7:
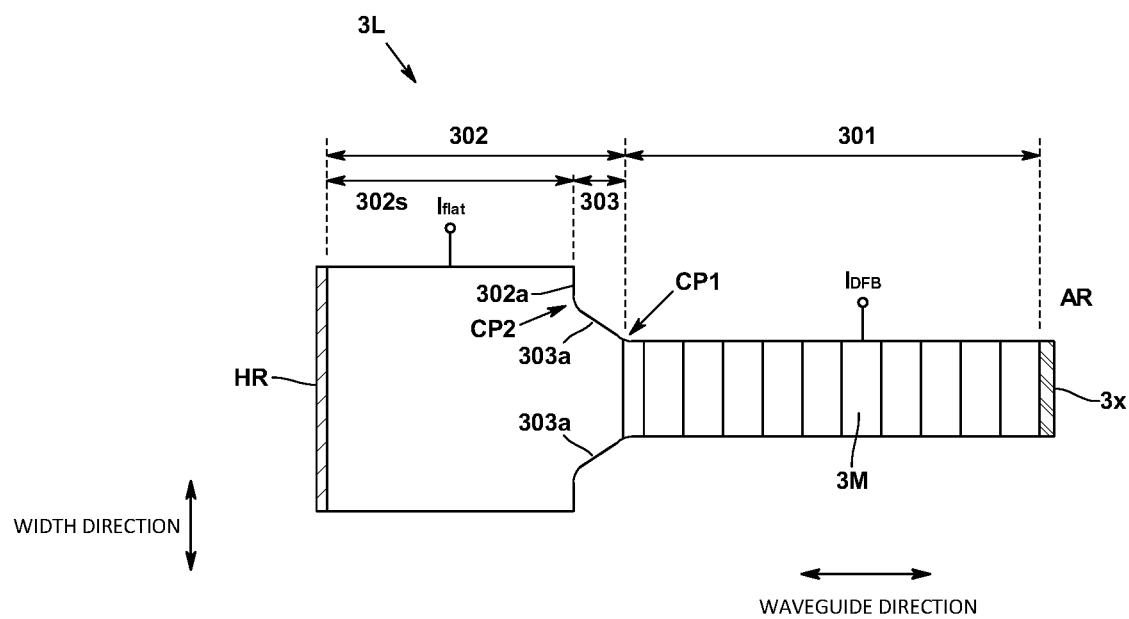
FIG. 7 is a plan view showing a waveguide of a semiconductor laser element of a variant embodiment.

For example, the configuration of the semiconductor laser element 3 when looked at in plan view is not limited to that described in the foregoing embodiment and, as is shown in FIG. 7, it is also possible to employ a structure in which both sides in the width direction of the connecting portion 303 are not continuous with both sides in the width direction of the rectangular portion 302s. More specifically, a structure may be employed in which both sides in the width direction of the connecting portion 303 are continuous with an end side 302a on the diffraction grating portion side of the rectangular portion 302s. In this case as well, it is desirable that the connection location CP1 between the diffraction grating portion 301 and the connecting portion 303, and/or the connection location CP2 between the rectangular portion 302s and the connecting portion 303 be formed in an R shape.

Moreover, the shape of the connecting portion 303 is not limited to a shape in which both sides in the width direction thereof are formed as straight lines, and they may instead be formed as curved lines. At this time, if a structure is employed in which the connecting portion 303 has a portion whose width becomes gradually broader approaching the flat portion 302 from the diffraction grating portion 301, then a portion whose width becomes temporarily narrower approaching the flat portion 302 from the diffraction grating portion 301, such as an hourglass shape or the like, may also be provided.

Figure 8:
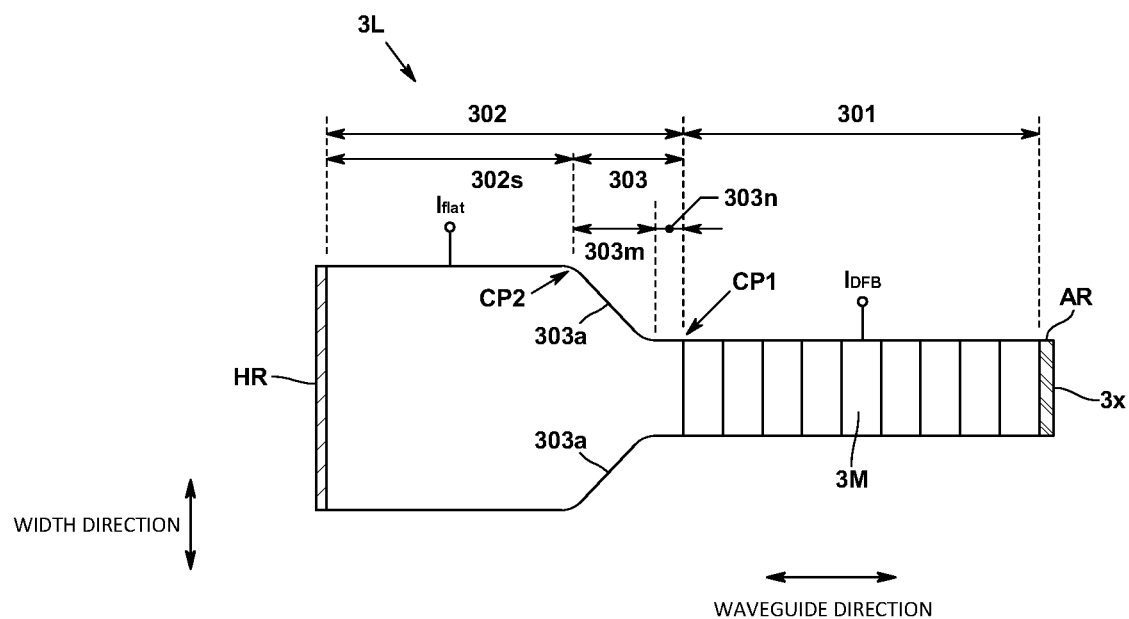
FIG. 8 is a plan view showing a waveguide of a semiconductor laser element of a variant embodiment.
Figure 9:
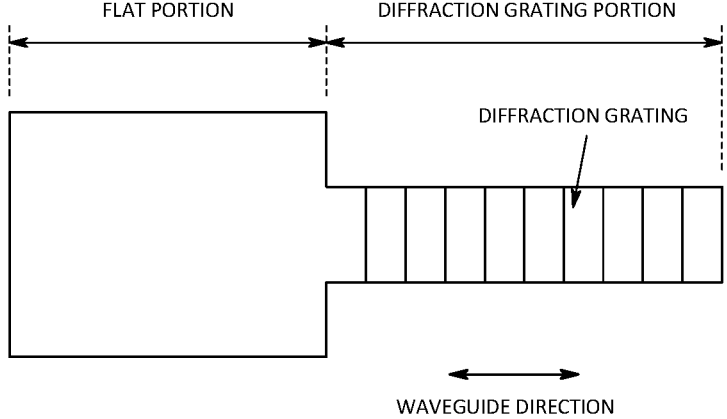
FIG. 9 is a plan view showing a waveguide of a semiconductor laser element that is serving as a comparative example of the present invention.

Furthermore, as is shown in FIG. 8, it is also possible to employ a structure in which the connecting portion 303 is provided with a tapered portion 303m whose width becomes continuously narrower approaching the connection location CP1 with the diffraction grating portion 301, and a narrow-width portion 303n that connects together the tapered portion 303m and the diffraction grating portion 301.

In addition to these, in the above-described embodiment, the upper electrode 91 is formed as a two-electrode structure that includes the electrode 91a for the diffraction grating portion 301, and the electrode 91b for the flat portion 302, however, it is also possible for a single electrode to be provided in common for both the diffraction grating portion 301 and the flat portion 302.

Furthermore, in the above-described embodiment, a structure is employed in which both the diffraction grating portion 301 and the flat portion 302 have the same width, however, it is also possible to employ a structure in which the width in the longitudinal direction of at least one of the diffraction grating portion 301 or the flat portion 302 changes. For example, a structure in which the flat portion 302 is not provided with the rectangular portion 302s may be used. In this case, for example, a taper-shaped structure may be employed in which the width of the flat portion 302 changes continuously from one end to the other end thereof.

The drive method used for the semiconductor laser element 3 may be any one of a continuous oscillation (CW) method, a pseudo-continuous oscillation (pseudo-CW) method, or a pulse oscillation method.

In the above-described embodiment a distributed feedback (DFB) type of semiconductor laser device is described, however, the present invention may also be applied to distributed reflection-type (DBR) semiconductor laser devices.

In the above-described embodiment, an example in which the semiconductor laser device 100 is used in the gas analysis device 10 is described, however, the semiconductor laser device 100 may also be used on other types of optical analysis devices, or in optical communication applications or the like.

Moreover, the subject being measured is not limited to being exhaust gas, and may be any of a variety of gases such as, for example, gases generated in a semiconductor manufacturing process, by-product gases generated in a material production plant, aspirated air, gases generated from batteries, and atmospheric air and the like. The subject being measured may also be a liquid.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as limited by the foregoing description and is only limited by the scope of the appended claims.

DESCRIPTION OF THE REFERENCE NUMERALS

10 . . . Gas Analysis Device
11 . . . Measurement Cell
12 . . . Photodetector
13 . . . Analysis Portion
100 . . . Semiconductor Laser Device
3L . . . Waveguide
3M . . . Diffraction Grating
2 . . . Semiconductor Substrate
3 . . . Semiconductor Laser Element
301 . . . Diffraction Grating Portion
302 . . . Flat Portion
302s . . . Rectangular Portion
303 . . . Connecting Portion
303m . . . Tapered Portion
303n . . . Narrow-Width Portion
CP1 . . . Connection Location Between Diffraction Grating Portion and Connecting Portion
CP2 . . . Connection Location Between Flat Portion and Connecting Portion 3x . . . Light-Emitting Surface
HR . . . High-Reflection Film
AR . . . Anti-Reflection Film
91a . . . First Electrode
91b . . . Second Electrode

INDUSTRIAL APPLICABILITY

According to the present invention, it is possible to provide a semiconductor laser device that enables single mode light to be stably output while also enabling the intensity thereof to be increased.

What is claimed is:

1. A quantum cascade laser comprising:
   a waveguide having
      a diffraction grating portion where a diffraction grating is formed and a flat portion where the diffraction grating is not formed and whose width is broader than that of the diffraction grating portion, wherein the flat portion includes a connecting portion whose width changes continuously approaching a connection location with the diffraction grating portion; and
      a rectangular portion that is formed in a rectangular shape, and wherein at least one of (i) the connection location between the diffraction grating portion and the connection portion or (ii) a connection location between the rectangular portion and the connecting portion is formed in an R shape,
      a high-reflection film provided on an end surface of the flat portion that is on an opposite side from the connecting portion, and
      an anti-reflection film provided on an end surface of the diffraction grating portion that is on an opposite side from the connecting portion.

2. The quantum cascade laser according to claim 1, wherein the width of the connecting portion becomes continuously narrower approaching the connection location with the diffraction grating portion.

3. The quantum cascade laser according to claim 1, wherein a maximum width of the connecting portion is not more than a maximum width of portions of the flat portion other than the connecting portion, and a minimum width of the connecting portion is not less than a maximum width of the diffraction grating portion.

4. The quantum cascade laser according to claim 1, wherein the connecting portion has a tapered portion whose width becomes continuously narrower approaching the connection location with the diffraction grating portion, and a narrow-width portion that joins the tapered portion and the diffraction grating portion together.

5. The quantum cascade laser according to claim 1, wherein a width dimension of a light-emitting end of the waveguide is 1~2 times an oscillation wavelength.

6. The quantum cascade laser according to claim 1, wherein a surface area of a region where the diffraction grating is not formed is not less than a surface area of a region where the diffraction grating is formed.

7. The quantum cascade laser according to claim 1, further comprising: a first electrode that supplies current to the diffraction grating portion; and a second electrode that is provided separately from the first electrode and supplies current to the flat portion.

8. A semiconductor laser device comprising a substrate; and a semiconductor laser element that is disposed on the substrate, wherein the semiconductor laser element is the quantum cascade laser according to claim 1.

9. A method of manufacturing a quantum cascade laser in which a diffraction grating is formed on a waveguide comprising:

structural body formation in which there is formed on a substrate a laminated structural body having a diffraction grating region where the diffraction grating is formed and a flat region where the diffraction grating is not formed; and waveguide formation in which a waveguide is formed by etching the laminated structural body in such a way that the laminated structural body is provided with a diffraction grating portion where the diffraction grating is formed, and a flat portion having a region where the diffraction grating is not formed and whose width is broader than that of the diffraction grating portion, and in such a way that the flat portion includes a connecting portion having a region whose width changes continuously approaching a connection location with the diffraction grating portion.

10. An analysis device that analyzes a subject to be measured that is contained in a sample, comprising:

a measurement cell into which the sample is introduced;

the quantum cascade laser according to claim 8 that irradiates laser light onto the measurement cell;

a photodetector that detects laser light transmitted through the measurement cell; and an analysis portion that analyzes the subject to be measured using a detection signal from the photodetector.

\* \* \* \* \*